(12) United States Patent
Kang

(10) Patent No.: US 7,489,566 B2
(45) Date of Patent: Feb. 10, 2009

(54) HIGH VOLTAGE GENERATOR AND RELATED FLASH MEMORY DEVICE

(75) Inventor: Yong Hoon Kang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 25 days.

(21) Appl. No.: 11/774,054

(22) Filed: Jul. 6, 2007

(65) Prior Publication Data

US 2008/0031078 A1 Feb. 7, 2008

(30) Foreign Application Priority Data

Jul. 7, 2006 (KR) .................. 10-2006-0063941

(51) Int. Cl.
*G11C 5/14* (2006.01)
(52) U.S. Cl. .................. 365/189.11; 365/185.23; 365/226; 327/536
(58) Field of Classification Search .................. 365/204
See application file for complete search history.

(56) References Cited

U.S. PATENT DOCUMENTS

| 5,592,456 | A * | 1/1997 | Miyashita et al. ........ 369/59.18 |
| 6,212,107 | B1 * | 4/2001 | Tsukada ................ 365/189.09 |
| 6,215,361 | B1 | 4/2001 | Lebouleux et al. |
| 6,989,718 | B2 | 1/2006 | Pretl et al. |
| 7,372,747 | B2 * | 5/2008 | Nam et al. ............. 365/189.09 |
| 2005/0168263 | A1 | 8/2005 | Fukuda et al. |
| 2005/0237824 | A1 * | 10/2005 | Umezawa et al. ...... 365/189.11 |

FOREIGN PATENT DOCUMENTS

| JP | 2002233135 | | 8/2002 |
| JP | 2003348822 | | 12/2003 |
| JP | 2005057972 | | 3/2005 |
| JP | 2005-190533 | | 7/2005 |
| KR | 1019960000837 | B1 | 1/1996 |
| KR | 100264206 | B1 | 5/2000 |
| KR | 1020010011502 | A | 2/2001 |
| KR | 1020050032826 | A | 4/2005 |
| KR | 1020050065424 | A | 6/2005 |

\* cited by examiner

*Primary Examiner*—Tan T. Nguyen
(74) *Attorney, Agent, or Firm*—Volentine & Whitt, PLLC

(57) ABSTRACT

A high voltage generator includes a charge pump generating a high voltage in response to a pumping clock signal, a charge/discharge circuit responsive to the pumping clock signal and charging the high voltage to generate an output voltage, a comparator for comparing the output voltage with a reference voltage to generate a comparison result, and a clock modification circuit adjusting a pumping slope of the charge pump in relation to the comparison result, wherein the clock modification circuit reduces the pumping slope when the high voltage reaches a target voltage level.

18 Claims, 6 Drawing Sheets

HIGH VOLTAGE GENERATOR AND RELATED FLASH MEMORY DEVICE

CROSS-REFERENCE TO RELATED APPLICATIONS

This non-provisional patent application claims priority under 35 U.S.C §119 to Korean Patent Application 10-2006-0063941 filed on Jul. 7, 2006, the subject matter of which is hereby incorporated by reference.

BACKGROUND OF THE INVENTION

The present invention relates to an erasable and programmable non-volatile memory device. More particularly, the invention relates to a high voltage generator circuit adapted for incorporation into a flash memory device.

Semiconductor memory devices may be roughly divided into volatile and non-volatile type devices. Volatile memory devices are characterized by an inability to retain stored data in the absence of applied electrical power. In contrast, non-volatile memory devices are able to retain stored data even in the absence of applied power. Conventional non-volatile memory devices include mask ROMs, programmable ROMs, erasable and programmable ROMs, electrically erasable and programmable ROMs, and the like. Among commercially available non-volatile memory devices, flash memory devices afford several notable advantages, including an ability to block erase memory cells, etc. As a result, flash memory is widely used to applications such as computers and memory cards needing high-speed operations.

Conventional flash memory devices may be divided into NOR type flash memory and NAND type flash memory based on the particular interconnection between memory cells and associated bit lines. For example, the NOR flash memory device is configured such that two or more cell transistors are connected in parallel to one bit line.

NOR flash memory may be programmed using an electrical phenomenon known as channel hot electron injection and may be erased using another electrical phenomenon known as Fowler-Nordheim (F-N) tunneling. NOR flash memory suffers from disadvantages associated with high density integration due to large current consumption, but also offers advantages related to high-speed memory operations.

NAND flash memory is configured such that two or more cell transistors are connected in series to one bit line. NAND flash memory may be both programmed and erased using F-N tunneling. NAND flash memory offers greater ease of device integration because it consumes relatively less current than NOR flash memory.

Flash memory functions in accordance with basic operations referred to as program, erase and read. Each of these basic operations requires the timely application of certain voltages to signal lines (e.g., word lines, bit lines, etc.) connected memory cells in an array. Flash memory operations require that some of these voltages be higher than the level of commonly applied power supply voltages. (Hereafter, any voltage applied to a flash memory array having a level higher than a power supply voltage applied flash memory will be term "a high voltage").

FIGS. 1 and 2 are, respectively, circuit diagram and corresponding waveform diagram showing one example of a conventional high voltage generator circuit. More detail regarding this exemplary high voltage generator circuit may be obtained by reviewing U.S. Pat. No. 5,642,309 entitled "Auto-Program Circuit in a Nonvolatile Semiconductor Memory Device," the subject matter of which is hereby incorporated by reference.

Referring to FIG. 1, as an output voltage of a high voltage generator circuit 50, a program voltage VPGM is divided by a trimming circuit 30 known as a voltage divider circuit. A divided voltage is compared with a reference voltage VREF by a comparator 40 A high voltage generation control circuit 20 controls supply of a clock signal to a high voltage generator 10 according to the comparison result. The high voltage generator 10 is known as a charge pump and generates the program voltage VPGM in response to clock signals ØPP and /ØPP. The high voltage generator circuit 50 controls an ON/OFF period for the high voltage generator 10 according to a comparison result between the divided voltage and the reference voltage VREF.

In the foregoing high voltage generation scheme, a delay period for turning OFF the charge pump once the program voltage VPGM has reached its target level (V_TARGET) is defined. Such a delay period is inevitable in a high voltage generation scheme having a feedback loop path including an RC delay. During the delay period, clock signals ØPP and /ØPP continue to be generated and applied to the high voltage generator 10. Application of these clock signals during the delay period causes the program voltage VPGM to attempt to increase above its target level (V_TARGET). However, feedback limiting drives the program voltage VPGM back down following increase above the target level (V_TARGET). This effect is illustrated in FIG. 2. The resulting program voltage now includes an upper level ripple.

SUMMARY OF THE INVENTION

In one embodiment, the invention provides a high voltage generator comprising; a charge pump generating a high voltage in response to a pumping clock signal, a charge/discharge circuit responsive to the pumping clock signal and charging the high voltage to generate an output voltage, a comparator for comparing the output voltage with a reference voltage to generate a comparison result, and a clock modification circuit adjusting a pumping slope of the charge pump in relation to the comparison result, wherein the clock modification circuit reduces the pumping slope when the high voltage reaches a target voltage level.

In another embodiment, the invention provides a flash memory device comprising; a memory cell array having a plurality of memory cells arranged in word lines and bit lines, and a high voltage generator circuit generating a high voltage supplied to a selected word line. The high voltage generator circuit comprises a charge pump generating a high voltage in response to a pumping clock signal, a charge/discharge circuit responsive to the pumping clock signal and charging the high voltage to generate an output voltage, a comparator for comparing the output voltage with a reference voltage to generate a comparison result, and a clock modification circuit adjusting a pumping slope of the charge pump in relation to the comparison result, wherein the clock modification circuit reduces the pumping slope when the high voltage reaches a target voltage level

DESCRIPTION OF EMBODIMENTS

The present invention will now be described in some additional detail with reference to the accompanying drawings. The invention may, however, be embodied in many different forms and should not be construed as limited to only the illustrated embodiments. Rather, the illustrated embodiments are presented as teaching examples. Throughout the written description and drawings, like reference numbers refer to like or similar elements.

Figure 3:
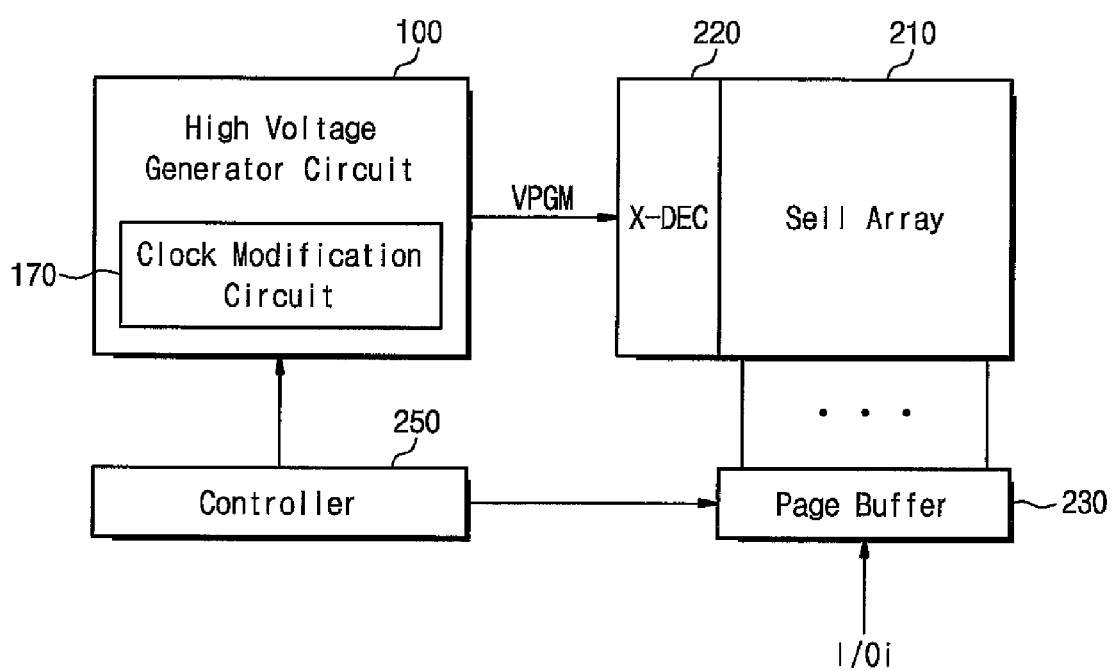
FIG. 3 is a partial block diagram showing a flash memory device according to an embodiment of the invention.

FIG. 3 is a block diagram showing a flash memory device according an embodiment of the invention. For purposes of explanation, the exemplary flash memory device shown in FIG. 3 is assumed to be a NAND flash memory device.

Referring to FIG. 3, the flash memory device includes a high voltage generator circuit 100, a memory cell array 210, a row decoder circuit (X-DEC) 220, a page buffer circuit 230, and a controller 250.

High voltage generator circuit 100 may be used to generate certain voltages commonly applied during flash memory device operations, such as a program voltage (VPGM), a pass voltage, a decoupling voltage, a read voltage, and the like. These voltages are generally high voltages and are generated in response to control signal(s) from controller 250. For ease of description, one example of high voltage generator circuit 100 generating a program voltage VPGM will be presented. However, other high voltages may be similarly generated.

It is assumed in the working example that each cycle during which data is programmed to the flash memory device consists of a plurality of program loops. Each program loop is divided into a program period and a program verify period. During each program period, the program voltage VPGM from high voltage generator circuit 100 is applied to a selected word line. During each program verify period, the selected word line is supplied with a read voltage VREAD, instead of the program voltage VPGM. Although not shown in figures, the read voltage VREAD may be produced from a charge pump independent from the operation of high voltage generator circuit 100.

In the illustrated example, high voltage generating circuit 100 includes a clock modification circuit 170. Clock modification circuit 170 is configured to adjust the pulse width (and/or, the frequency, and/or the amplitude) of a pumping clock. The pumping clock may be used to control the pumping operation of a charge pump. Alternately or additionally, the pumping clock may be used to modify a drive capacitance value associated with the charge pump when the program voltage VPGM reaches a target level. In accordance with this configuration, a corresponding pumping slope may be adjusted slowly once the program voltage VPGM has reached its target level. Accordingly, although an undesired pumping operation may continue past the point where program voltage VPGM has reached its target level, the size of any resulting voltage ripple on the program voltage VPGM may be reduced due to the reduced pumping slope.

Controller 250 controls the overall program operation of the flash memory device. Controller 250 generates a plurality of control signals needed to generate the program voltage VPGM in response to a program command received by controller 250 via conventionally arranged input/output pins.

Memory cell array 210 consists of a plurality of memory cell blocks, each of which includes a plurality of cell strings (or "NAND strings"). Each of the cell strings includes a string select transistor and a ground select transistor. Between the select transistors, each cell string includes a plurality of floating gate transistors that function as memory cells. The respective channels of the floating gate transistors are serially connected between a channel of the string select transistor and a channel of the ground select transistor. Each word line is commonly connected to control the gates of the floating gate transistors in a common row, and each bit line is connected to a corresponding cell string.

Rows (or, word lines) of memory cell array 210 are driven by row decoder circuit 220, and columns (or, bit lines) thereof are driven by page buffer circuit 230. Row decoder circuit 220 selects one of a plurality of word lines according to received row address information. Row decoder circuit 220 supplies word line voltages to selected and unselected word lines according to a current operation. For example, during a program operation, row decoder circuit 220 applies the program voltage VPGM to a selected word line and a pass voltage or a decoupling voltage to unselected word lines. During a read operation, row decoder circuit 220 applies a ground voltage to a selected word line and a read voltage to unselected word lines.

The bit lines arranged in memory cell array 210 are electrically connected to page buffer circuit 230. Page buffer circuit 230 may include page buffers corresponding to the bit lines, respectively. Alternatively, each page buffer can be configured to be shared by a pair of bit lines. Page buffer circuit 230 is controlled by controller 250. Each page buffer functions as a sense amplifier or a write driver according to an operation mode. For example, page buffer circuit 230 supplies bit lines with a power supply voltage (or, a program inhibit voltage) or a ground voltage (or, a program voltage) according to the data to be programmed during a program operation. During a read/verify operation, page buffer circuit 230 senses data from memory cells in a selected word line via bit lines. It is then determined whether a memory cell is a programmed cell or an erased cell based on a sense operation of page buffer circuit 230.

During a program operation in the flash memory device, to stably generate the program voltage VPGM is very important to increase programming accuracy. In order to stably generate the program voltage VPGM, a pumping slope is adjusted by modifying a pulse width (or, a frequency or an amplitude) of a pumping clock or a drive capacitance value of a charge pump. In this manner, it is possible to avoid forming a ripple on the program voltage VPGM, thereby generating a more stable program voltage VPGM.

Figure 4:
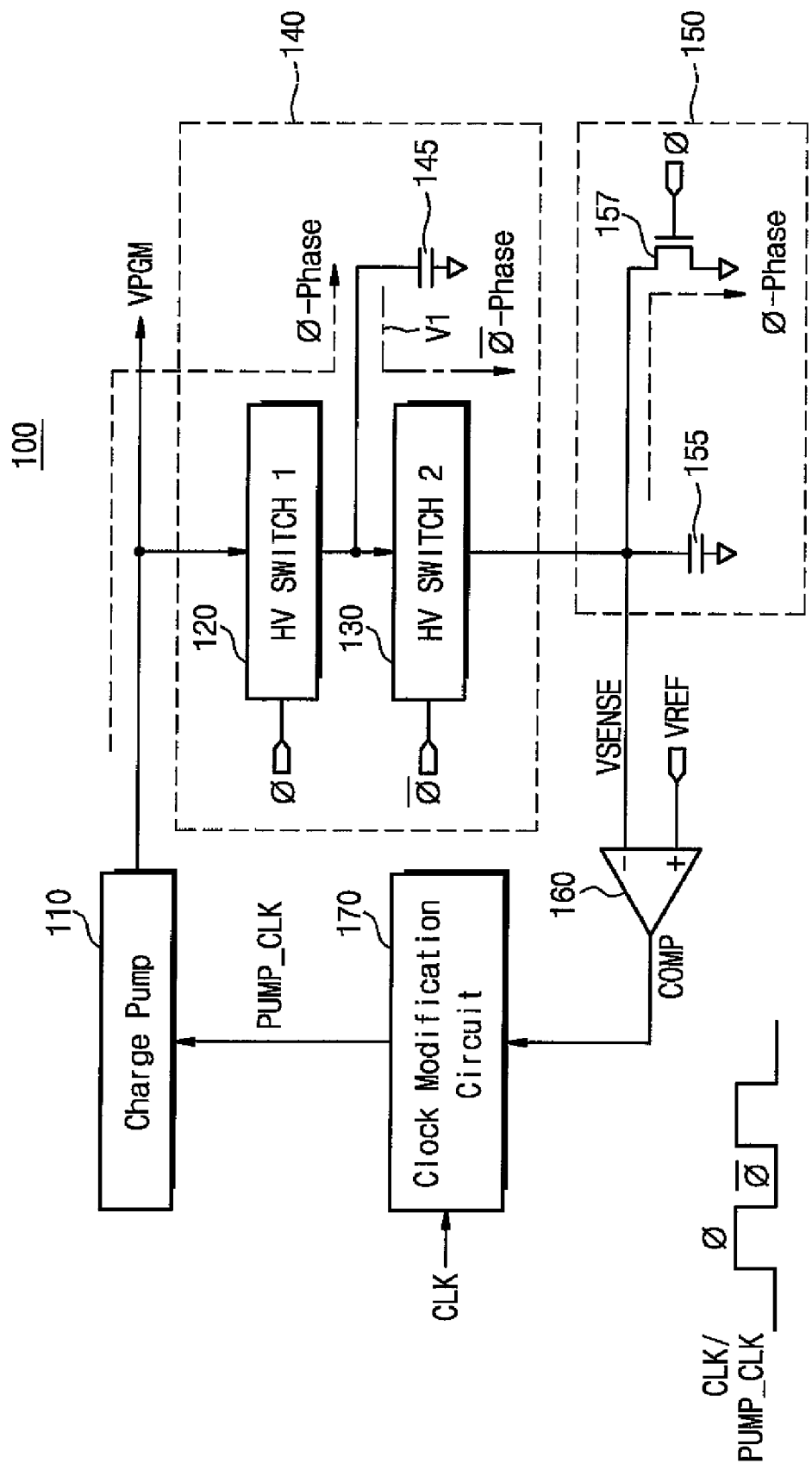
FIG. 4 is a block diagram showing one example of a high voltage generator circuit capable of being incorporated into a flash memory device according to an embodiment of the invention.

FIG. 4 is a block diagram further illustrating the high voltage generator circuit 100 of FIG. 3 in some additional detail. Referring to FIG. 4, the high voltage generator circuit includes a charge pump 110, a first charge/discharge circuit 140, a second charge/discharge circuit 150, a comparator circuit 160, and a clock modification circuit 170.

First and second charge/discharge circuits 140 and 150 function as a circuit charging a program voltage VPGM from the charge pump 110. Comparator circuit 160 compares a reference voltage VREF and a sample of the program voltage VPGM charged by first and second charge/discharge circuits 140 and 150. Clock modification circuit 170 modifies a pumping clock signal (PUMP_CLK) based on the comparison result (COMP) provided by comparator circuit 160.

In the illustrated example, charge pump 110 generates the program voltage VPGM in response to the pumping clock signal PUMP_CLK from clock modification circuit 170. Clock modification circuit 170 functions as a control circuit adjusting the level of the program voltage VPGM. When the program voltage VPGM reaches its target level, clock modification circuit 170 controls the definition of the pumping clock signal PUMP_CLK so as to change the effective pumping slope (i.e., it is reduced).

The pumping slope may be controlled in various manners to affect the reduced pumping slope. For example, the pumping slope may be controlled by adjusting the pulse width of the pumping clock signal PUMP_CLK, the frequency of the pumping clock signal PUMP_CLK, and/or the amplitude of the pumping clock signal PUMP_CLK. These alternatives will be more or less useful based on the particular configuration of charge pump 110.

In the illustrative description that follows, it is assumed as an example that the pulse width of the pumping clock signal PUMP_CLK is adjusted to affect a reduced pumping slope. However, in a case where the frequency of the pumping clock signal PUMP_CLK is adjusted to adjust the pumping slope, clock modification circuit 170 may be implemented using a frequency modulator. Alternatively, in a case that amplitude of the pumping clock signal PUMP_CLK is adjusted to adjust the pumping slope, clock modification circuit 170 may be implemented as a gain modulator.

Further, in a case where the pumping clock signal PUMP_CLK modifies the pumping slope by changing a drive capacitance value associated with charge pump 110, a plurality of capacitors and related plurality of switches may be used to implement clock modification circuit 170. With this configuration, selective connections may be made to control the resulting drive capacitance of charge pump 110. That is, a drive capacitance value for charge pump 110 may be changed through selective capacitive coupling between capacitors.

First charge/discharge circuit 140 includes a first high voltage switch 120, a second high voltage switch 130, and a first capacitor 145 having a first capacitance value. The program voltage VPGM received from charge pump 110 is applied to first high voltage switch 120 which is turned ON in response to a first phase Ø of the pumping clock signal PUMP_CLK (or a clock signal CLK). As first high voltage switch 120 is turned ON, the program voltage VPGM passing through first high voltage switch 120 is applied to second high voltage switch 130 and first capacitor 145. First capacitor 145 charges the program voltage VPGM received from first high voltage switch 120 during an ON period of first high voltage switch 120.

The clock signal CLK and the pumping clock signal PUMP_CLK coincide with each other until the program voltage VPGM from charge pump 110 reaches its target level. When the program voltage VPGM reaches its target level, the pulse width of the pumping clock signal PUMP_CLK becomes different relative to the clock signal CLK. It is assumed in this example that "the pulse width" of the pumping clock signal PUMP_CLK indicates a period during which each phase is maintained. The pulse width of the pumping clock signal PUMP_CLK may be modified by clock modification circuit 170. The ON period for first high voltage switch 120, that is, a charge period for first capacitor 145 may be changed in accordance with the period during which the first phase Ø is maintained.

Continuously, if the phase of the pumping clock signal PUMP_CLK is changed from the first phase Ø to the second phase /Ø, first high voltage switch 120 is turned ON in response to the first phase Ø of the pumping clock signal PUMP_CLK, and second high voltage switch 130 is turned ON in response to the second phase /Ø. With the switching operation between first and second high voltage switches 120 and 130, a voltage V1 charged by first capacitor 145 is supplied from second charge/discharge circuit 140 via second high voltage switch 130.

Second charge/discharge circuit 150 includes a second capacitor 155 having a second capacitance value and a switch transistor 157 for switching charge and discharge operations of second capacitor 155. Switch transistor 157 is turned ON in response to the first phase Ø of the pumping clock signal PUMP_CLK and discharges second capacitor 155 to ground, thereby resetting second capacitor 155.

Switch transistor 157 is turned OFF in response to the second phase /Ø of the pumping clock signal PUMP_CLK, and second capacitor 155 connected in parallel with switch transistor 157 begins to charge. At this time, second high voltage switch 130 is turned ON in response to the second phase /Ø of the pumping clock signal PUMP_CLK, and output voltage V1 developed by first charge/discharge circuit 140 is output. Output voltage V1 from second high voltage switch 130 is supplied to second capacitor 155 and comparator circuit 150 at the same time. At this time, a voltage supplied to comparator circuit 160 is referred to as a sense voltage VSENSE, whose level has a level lower than that of the program voltage VPGM from charge pump 110. This comes from a capacitive effect of second capacitor 155. Therefore, it is possible to determine a point in time when the pumping slope is modified, based on the capacitance of second capacitor 155. With this configuration, no time based comparator is needed to determine the point in time when the pumping slope is adjusted.

In the illustrated example of FIG. 4, comparator circuit 160 receives the sense voltage VSENSE from second high voltage switch 130 and compares the sense voltage VSENSE with a reference voltage VREF. For example, when the sense voltage VSENSE is lower than the reference voltage VREF, comparator circuit 160 generates a positive comparison signal COMP. When the sense voltage VSENSE is higher than the reference voltage VREF, comparator circuit 160 generates a negative comparison signal COMP.

Clock modification circuit 170 adjusts the pulse width of the pumping clock signal PUMP_CLK in response to the comparison signal COMP and a clock signal CLK. For example, when the sense voltage VSENSE is lower than the reference voltage VREF, pumping modification circuit 170 modifies the pulse width of the pumping clock signal PUMP_CLK in response to a positive comparison signal COMP so as to have the same pulse width of the clock signal CLK. However, when the sense voltage VSENSE is higher than the reference voltage VREF, pumping modification circuit 170 modifies the pulse width of the pumping clock signal PUMP_CLK in response to a negative comparison signal COMP so as to have a narrower pulse width than that of the clock signal CLK. Thus, when the sense voltage VSENSE is higher than the reference voltage VREF, the program voltage VPGM has reached its target level.

Once the program voltage has reached its target level, the pumping operation of charge pump 110 is generally discontinued. However, since the processes of sensing a pumping result and controlling a pumping operation are controlled by a feedback loop having a temporal feedback lag, a delay will exist between the pumping operation turn-OFF point and the point in time when the program voltage VPGM reaches its target level. During this delay period, some undesired pumping operation may be carried out, and the some delay is inevitable in a high voltage generation scheme having a feedback control loop.

However, embodiments of the invention effectively reduce the pumping slope during undesired continuations in the pumping operation. So, although some undesired pumping operation may be carried out after the pumping clock signal PUMP_CLK reaches its target level, the resulting "increased" level of the program voltage VPGM is reduced. This means that voltage variation (i.e., ripple) of the program voltage VPGM can be significantly reduced.

As described above, high voltage generator circuit 100 according to an embodiment of the invention does not have a resistor circuit for dividing the program voltage VPGM. On the other hand, high voltage generator circuit 100 controls the pumping operation using a sense voltage VSENSE generated through first and second high voltage switches 120 and 130 and first and second charge/discharge circuits 140 and 150. Accordingly, it is possible to simplify the circuit structure and reduce overall chip size. Further, it is possible to realize a high-speed operation since a sense voltage VSENSE is determined by simple switching and charge/discharge operations.

In embodiments of the present invention, it is possible to modify the pulse width of a pumping clock PUMP_CLK differently before and after the point at which the program voltage VPGM reaches its target level V_TARGET. Accordingly, it is unnecessary to previously adjust a pumping capacity before the program voltage VPGM reaches its target level V_TARGET. As a result, the control approach and its implementing circuit configuration may be simplified.

Figure 5:
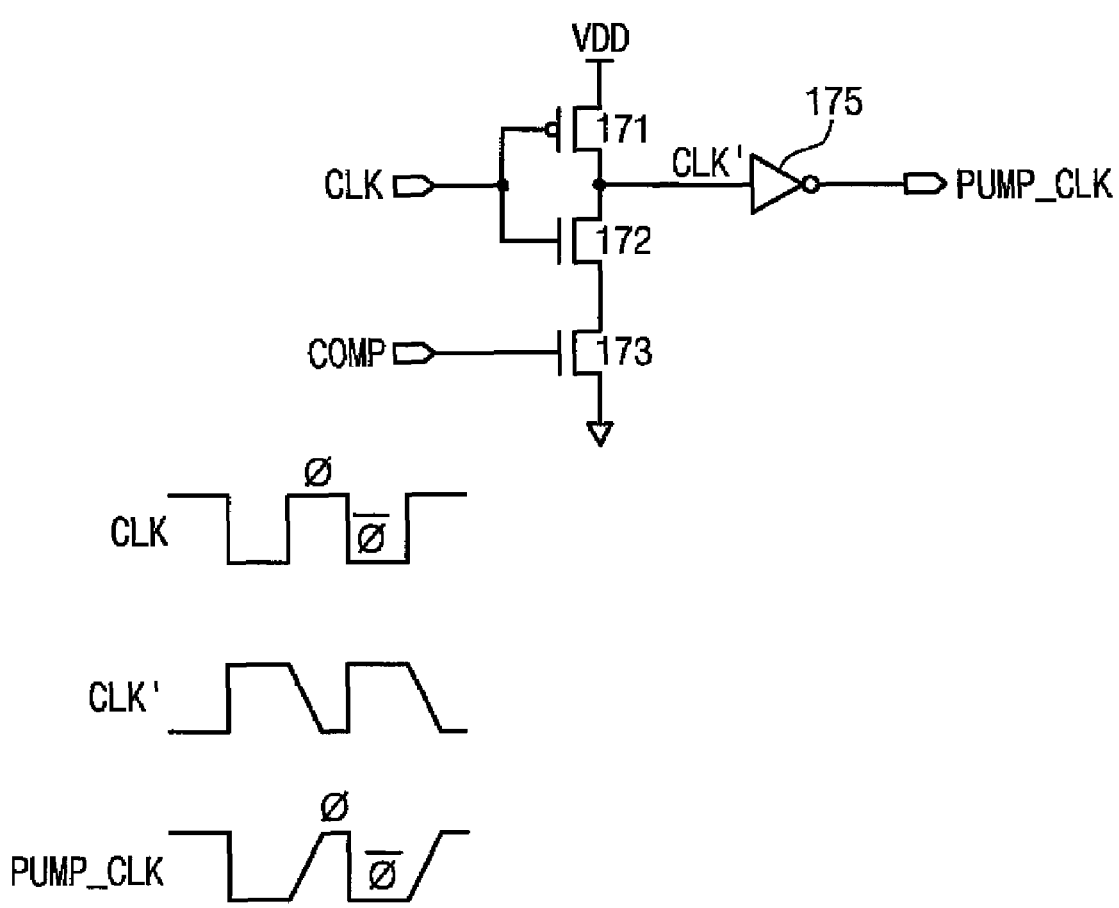
FIG. 5 is a circuit diagram showing one possible example of a clock modification circuit susceptible to incorporation into a flash memory device according to an embodiment of the invention.

FIG. 5 is a circuit diagram further illustrating in one possible example the clock modification circuit of FIG. 4 in some additional detail. Referring to FIG. 5, clock modification circuit 170 includes first to third transistors 171, 172 and 173 connected in series between a power supply voltage VDD and ground voltage, and an inverter 175 inverting an output of the first and second transistors 171 and 172.

The first and second transistors 171 and 172 constitute an inverting circuit where their gate terminals are connected commonly. A clock signal CLK is applied to the gate terminals of first and second transistors 171 and 172, which invert the input clock signal CLK. An inverted clock signal CLK' is output from a common node of first and second transistors 171 and 172. The inverted clock signal CLK' is output as a pumping clock signal PUMP_CLK via inverter 175.

Third transistor 173 receives a comparison signal COMP through its gate terminal, and adjusts the amount of current discharged from first and second transistors 171 and 172. The pulse width of the inverted clock signal CLK' from first and second transistors 171 and 172 is determined by a level of the comparison signal COMP that is applied to a gate of third transistor 173. For example, in a case where the comparison signal COMP has a positive value, third transistor 173 is turned ON, and the output of first and second transistors 171 and 172 drops rapidly towards ground. In this case, although not shown in figures, an output CLK' of first and second transistors 171 and 172 has the same pulse width of an input clock signal CLK and a phase opposite to that of the input clock signal CLK.

By comparison, in a case where the comparison signal COMP has a negative value, that is, when no pumping operation is needed, third transistor 173 is turned OFF. This allows the output of first and second transistors 171 and 172 to drop slowly towards ground. In this case, the output of first and second transistors 171 and 172, that is, a falling edge of an inverted clock signal CLK' having an opposite phase to that of the clock signal CLK is formed slowly as illustrated in FIG. 5. The slow falling edge of the inverted clock signal CLK' allows the pulse width of a corresponding phase to be narrowed. The narrowed pulse width of the inverted clock signal reduces the pumping slope of the pumping clock signal PUMP_CLK. In turn, the pulse width of the pumping clock signal PUMP_CLK reduces the pumping slope of charge pump 110. The resulting ripple on the program voltage VPGM is reduced due to the reduced pulse width although the pumping operation continues past the point where turn OFF point for charge pump 110 when the program voltage VPGM reaches its target level V_TARGET.

Figure 6:
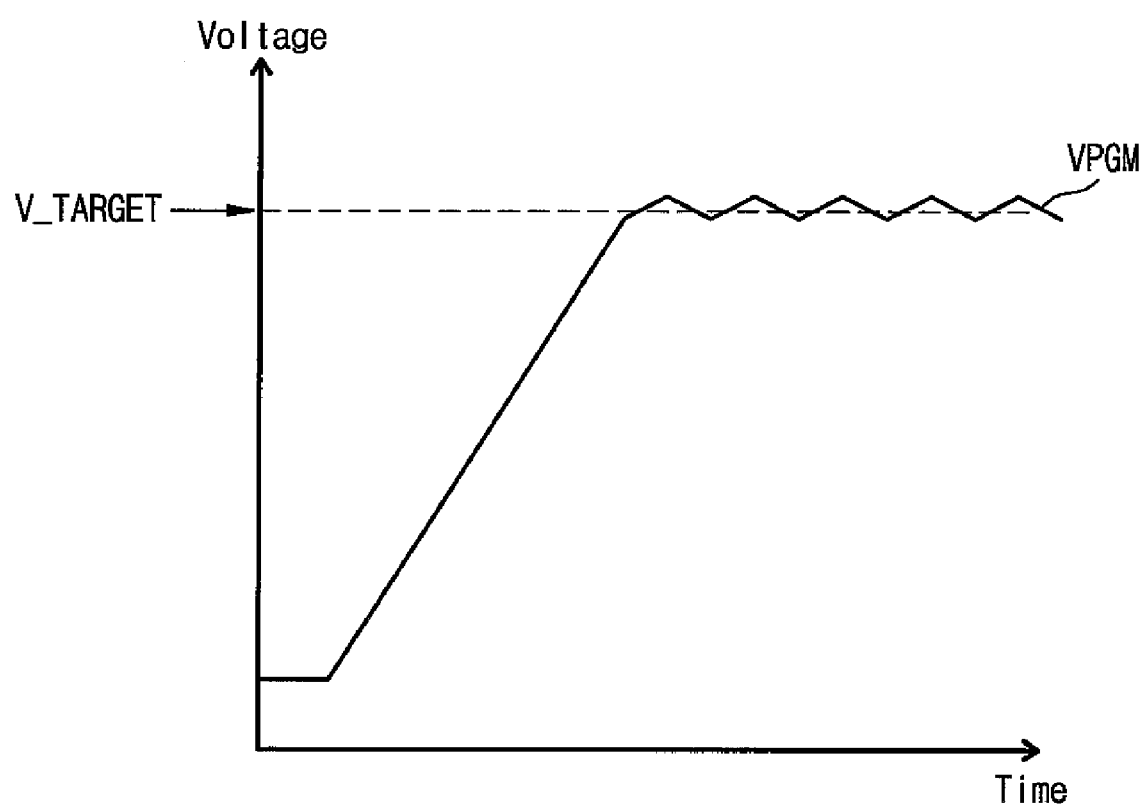
FIG. 6 is a related waveform diagram showing an output voltage for a high voltage generator circuit according to an embodiment of the invention.

FIG. 6 is a diagram showing a waveform of an output of a high voltage generator circuit according to an embodiment of the invention.

Figure 1:
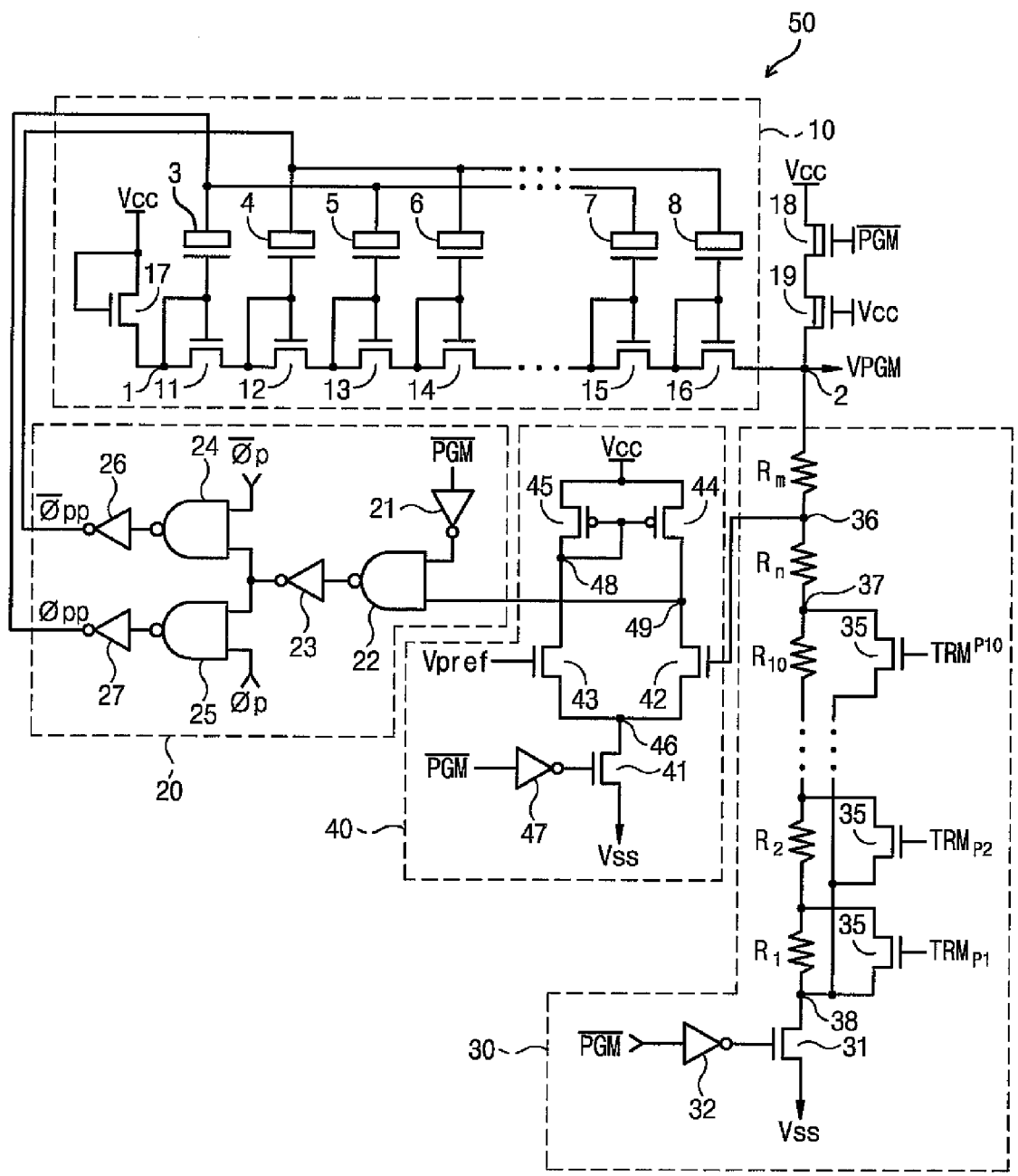
FIG. 1 is a circuit diagram showing a conventional high voltage generator circuit.
Figure 2:
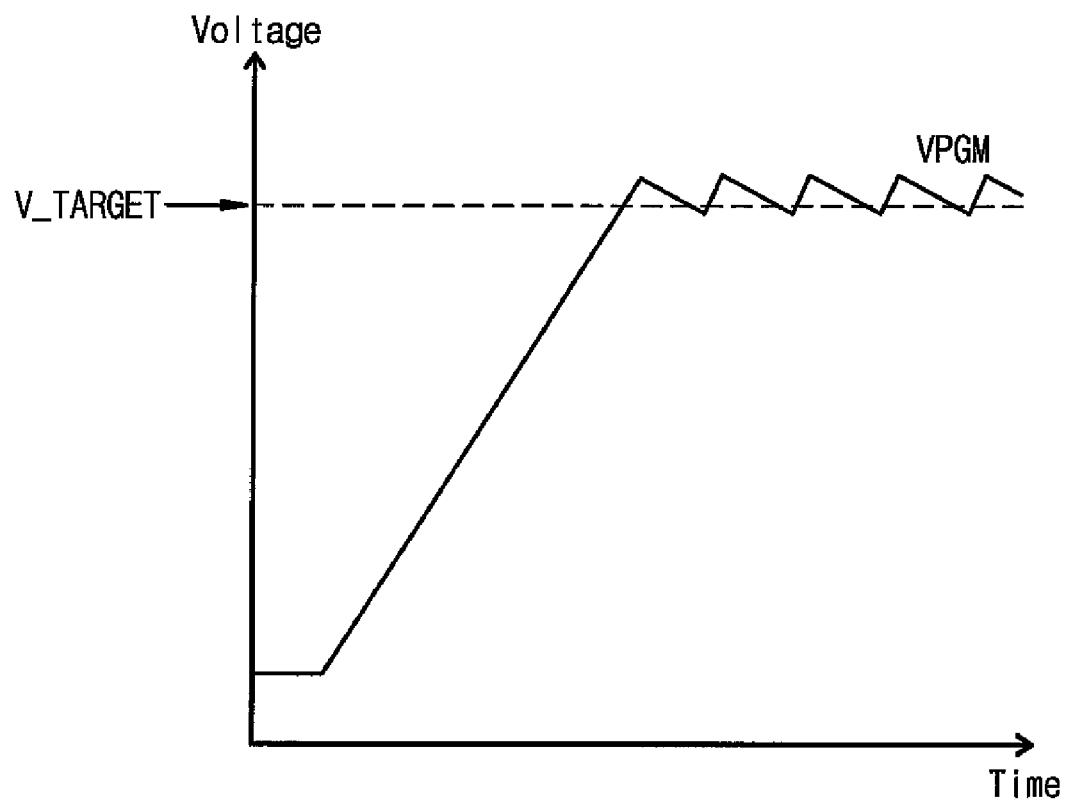
FIG. 2 is a waveform diagram of an output voltage for the high voltage generator circuit of FIG. 1.

Referring to FIGS. 4 and 6, the pumping slope after the program voltage VPGM reaches its target level V_TARGET is reduced from the pumping slope before the program voltage VPGM reached its target level V_TARGET. Because of the reduced pumping slope, the ripple formed on the program voltage VPGM is reduced as compared with the conventional high voltage generators. (Compare, FIG. 2).

The reduced pumping slope may be realized as a pulse width of the pumping clock signal PUMP_CLK is reduced, an adjusted modulation frequency, or an adjusted amplitude. Alternately, the reduced pumping slope may be realized by changing a drive capacitance for charge pump 110.

Although the present invention has been described in connection with selected embodiments of the invention, it is not limited thereto. It will be apparent to those skilled in the art that various substitutions, modifications and changes may be made thereto without departing from the scope of the invention as defined by the following claims.

What is claimed is:

1. A high voltage generator comprising:
   a charge pump generating a high voltage in response to a pumping clock signal;
   a charge/discharge circuit responsive to the pumping clock signal and charging the high voltage to generate an output voltage;
   a comparator for comparing the output voltage with a reference voltage to generate a comparison result; and
   a clock modification circuit adjusting a pumping slope of the charge pump in relation to the comparison result, wherein the clock modification circuit reduces the pumping slope when the high voltage reaches a target voltage level.

2. The high voltage generator circuit of claim 1, wherein the clock modification circuit reduces the pumping slope of the charge pump by at least one of changing a pulse width for the pumping clock signal, adjusting a frequency of the pumping clock signal, or adjusting an amplitude of the pumping clock signal.

3. The high voltage generator circuit of claim 2, wherein the clock modification circuit reduces the pumping slope of the charge pump in relation to a first and second phase of the pumping clock signal.

4. The high voltage generator circuit of claim 1, wherein the clock modification circuit comprises:
   a first inverter inverting a clock signal;
   a control circuit responsive to the comparison result and adjusting the speed with which the clock signal applied to the first inverter is inverted; and
   a second inverter inverting the output of the first inverter to generate the pumping clock signal.

5. The high voltage generator circuit of claim 1, wherein the clock modification circuit reduces the pumping slope by changing a driving capacitance value associated with the charge pump.

6. The high voltage generator circuit of claim 5, wherein the clock modification circuit comprises:
   a plurality of capacitors and a corresponding plurality of switches,
   wherein each one of the plurality of capacitors is selectively connected to a corresponding capacitor associated with the charge pump through a switching operation applied to the plurality of switches.

7. The high voltage generator circuit of claim 1, wherein the charge/discharge circuit comprises:
   a first charge/discharge circuit charging the high voltage received from the charge pump in response to a first phase of the pumping clock signal and generating the output voltage in response to a second phase of the pumping clock signal; and
   a second charge/discharge circuit supplying the output voltage from the first charge/discharge circuit to the comparator in response to the second phase of the pumping clock signal.

8. The high voltage generator circuit of claim 7, wherein the first charge/discharge circuit comprises:
   a first high voltage switch outputting the high voltage in response to the first phase of the pumping clock signal;
   a first capacitor charging the high voltage received from the first high voltage switch; and
   a second high voltage switch outputting a voltage charged in the first capacitor as the output voltage in response to the second phase of the pumping clock signal.

9. The high voltage generator circuit of claim 8, wherein the second charge/discharge circuit includes:
   a second capacitor outputting a voltage from the second high voltage switch to the comparator; and
   a discharge switch discharging a charged voltage in the second capacitor to ground in response to the first phase of the pumping clock signal, during a charging period of the first capacitor.

10. A flash memory device comprising:
    a memory cell array having a plurality of memory cells arranged in word lines and bit lines; and
    a high voltage generator circuit generating a high voltage supplied to a selected word line and comprising:
      a charge pump generating a high voltage in response to a pumping clock signal;
      a charge/discharge circuit responsive to the pumping clock signal and charging the high voltage to generate an output voltage;
      a comparator for comparing the output voltage with a reference voltage to generate a comparison result; and
      a clock modification circuit adjusting a pumping slope of the charge pump in relation to the comparison result, wherein the clock modification circuit reduces the pumping slope when the high voltage reaches a target voltage level.

11. The flash memory device of claim 10, wherein the clock modification circuit reduces the pumping slope of the charge pump by at least one of changing a pulse width for the pumping clock signal, adjusting a frequency of the pumping clock signal, or adjusting an amplitude of the pumping clock signal.

12. The flash memory device of claim 11, wherein the clock modification circuit reduces the pumping slope of the charge pump in relation to a first and second phase of the pumping clock signal.

13. The flash memory device of claim 10, wherein the clock modification circuit comprises:
    a first inverter inverting a clock signal;
    a control circuit responsive to the comparison result and adjusting the speed with which the clock signal applied to the first inverter is inverted; and
    a second inverter inverting the output of the first inverter to generate the pumping clock signal.

14. The flash memory device of claim 10, wherein the clock modification circuit reduces the pumping slope by changing a driving capacitance value associated with the charge pump.

15. The flash memory device of claim 14, wherein the clock modification circuit comprises:
    a plurality of capacitors and a corresponding plurality of switches,
    wherein each one of the plurality of capacitors is selectively connected to a corresponding capacitor associated with the charge pump through a switching operation applied to the plurality of switches.

16. The flash memory device of claim 10, wherein the charge/discharge circuit comprises:
    a first charge/discharge circuit charging the high voltage received from the charge pump in response to a first phase of the pumping clock signal and generating the output voltage in response to a second phase of the pumping clock signal; and
    a second charge/discharge circuit supplying the output voltage from the first charge/discharge circuit to the comparator in response to the second phase of the pumping clock signal.

17. The flash memory device of claim 16, wherein the first charge/discharge circuit comprises:
    a first high voltage switch outputting the high voltage in response to the first phase of the pumping clock signal;
    a first capacitor charging the high voltage received from the first high voltage switch; and
    a second high voltage switch outputting a voltage charged in the first capacitor as the output voltage in response to the second phase of the pumping clock signal.

18. The flash memory device of claim 17, wherein the second charge/discharge circuit includes:
    a second capacitor outputting a voltage from the second high voltage switch to the comparator; and
    a discharge switch discharging a charged voltage in the second capacitor to ground in response to the first phase of the pumping clock signal, during a charging period of the first capacitor.

* * * * *